(12) United States Patent
Saito et al.

(10) Patent No.: US 7,948,061 B2
(45) Date of Patent: May 24, 2011

(54) GROUP III NITRIDE-BASED COMPOUND SEMICONDUCTOR DEVICE

(75) Inventors: Yoshiki Saito, Aichi-ken (JP); Yasuhisa Ushida, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 356 days.

(21) Appl. No.: 12/219,695

(22) Filed: Jul. 25, 2008

(65) Prior Publication Data

US 2009/0065900 A1 Mar. 12, 2009

(30) Foreign Application Priority Data

Jul. 27, 2007 (JP) ................................. 2007-195419

(51) Int. Cl.
*H01L 29/04* (2006.01)
(52) U.S. Cl. .......... 257/627; 257/94; 257/103; 257/201; 257/E21.292
(58) Field of Classification Search ................ 257/79, 257/94, 103, 201, 618, 622, 627, E21.292
See application file for complete search history.

(56) References Cited

U.S. PATENT DOCUMENTS

2009/0146160 A1* 6/2009 Nakahara ................. 257/94

FOREIGN PATENT DOCUMENTS

| CN | 1641890 A | | 7/2005 |
|---|---|---|---|
| JP | 10-65213 | | 3/1998 |
| JP | 10065213 A | * | 3/1998 |
| JP | 2000-216497 | | 8/2000 |
| JP | 2002-16312 | | 1/2002 |
| JP | 2004-71657 | | 3/2004 |
| JP | 2004071657 A | * | 3/2004 |
| JP | 2004-172568 | | 6/2004 |
| JP | 2007-43164 | | 2/2007 |
| JP | 2007-157766 | | 6/2007 |

OTHER PUBLICATIONS

Chinese Office Action dated Dec. 25, 2009 and English translation thereof.
Japanese Office Action dated Apr. 6, 2010, with English translation.
Japanese Office Action dated Nov. 10, 2009, for Japanese Patent Application No. 2007-195419 (and partial English translation).

* cited by examiner

*Primary Examiner* — Evan Pert
*Assistant Examiner* — Scott Wilson
(74) *Attorney, Agent, or Firm* — McGinn IP Law Group, PLLC

(57) ABSTRACT

A characteristic feature of the invention is to form, in a Group III nitride-based compound semiconductor device, a negative electrode on a surface other than a Ga-polar C-plane. In a Group III nitride-based compound semiconductor light-emitting device, there are formed, on an R-plane sapphire substrate, an n-contact layer, a layer for improving static breakdown voltage, an n-cladding layer made of a multi-layer structure having ten stacked sets of an undoped $In_{0.1}Ga_{0.9}N$ layer, an undoped GaN layer, and a silicon (Si)-doped GaN layer, a multi-quantum well (MQW) light-emitting layer made of a combination of $In_{0.25}Ga_{0.75}N$ well layers and GaN barrier layers stacked alternatingly, a p-cladding layer made of a multi-layer structure including a p-type $Al_{0.3}Ga_{0.7}N$ layer and a p-$In_{0.08}Ga_{0.92}N$ layer, and a p-contact layer (thickness: about 80 nm) made of a stacked structure including two p-GaN layers having different magnesium concentrations. Through etching, the n-contact layer having a thickness direction along the c-axis is provided with stripe-patterned microditches each having side walls, which assume a C-plane, whereby ohmic contact is established between a negative electrode and each C-plane side wall.

19 Claims, 2 Drawing Sheets

GROUP III NITRIDE-BASED COMPOUND SEMICONDUCTOR DEVICE

BACKGROUND OF THE INVENTION

1. Field of the Invention

The present invention relates to a Group III nitride-based compound semiconductor device having a characteristic shape of an n-type region where a negative electrode has been provided. As used herein, the term "Group III nitride-based compound semiconductor" encompasses a semiconductor represented by the formula $Al_xGa_yIn_{1-x-y}N$ ($0 \leq x \leq 1$, $0 \leq y \leq 1$, $0 \leq x+y \leq 1$); such a semiconductor containing a predetermined element so as to attain, for example, an n-type/p-type conduction; and such a semiconductor in which a portion of a Group III element is substituted by B or Tl, and a portion of the Group V element is substituted by P, As, Sb, or Bi.

2. Background Art

In the development of $Al_xGa_yIn_{1-x-y}N$ semiconductors, crystallinity of the semiconductor has been enhanced, and conductivity thereof has been well-controlled, leading to production of a variety of semiconductor devices such as light-emitting diodes, laser diodes, and HEMTs. Currently, in a typical production process for semiconductor devices, a plurality of Group III nitride-based compound semiconductor layers are formed through epitaxial growth on a C-plane or A-plane sapphire substrate, silicon substrate, or SiC substrate. In many cases, when such Group III nitride-based compound semiconductor epitaxial layers are formed on the aforementioned hetero-substrate, the growth surface of epitaxial growth is a C-plane such that the thickness of each Group III nitride-based compound semiconductor layer increases along the c-axis. Also, when epitaxial growth is performed on a GaN thick layer having a C-plane as a main plane and serving as a growth substrate, the growth surface of an epitaxial is a C-plane such that the thickness of the epitaxial film increases along the c-axis.

Meanwhile, when the thickness direction of a GaN substrate is the c-axis direction, one surface normal to the c-axis is a Ga-polar surface, and the other surface is an N-polar surface. The Ga-polarity is the direction of the vector from the Ga atom to the nitrogen atom between Ga and nitrogen atoms which are connected with each other parallel to c-axis. Whereas the nitrogen-polarity is the direction of the vector from the nitrogen atom to the Ga atom between nitrogen and Ga atoms which are connected with each other parallel to c-axis. Accordingly, Ga-polar surface is defined as the surface whose normal vector oriented to the outside is equal to the Ga-polarity. Whereas nitrogen-polar surface is defined as the surface whose normal vector oriented to the outside is equal to the nitrogen-polarity.

When GaN is epitaxially grown on the aforementioned hetero-substrate such that the C-plane is a growth surface, the uppermost layer of the epitaxial film assumes a Ga-polar surface. When a C-plane GaN substrate is employed and GaN is epitaxially grown on the Ga-polar surface, the uppermost layer of the epitaxial film assumes a Ga-polar surface. However, those skilled in the art know that when epitaxial growth is performed on the N-polar surface of the GaN substrate through MOVPE or halide VPE, an epitaxial film having high crystallinity cannot be formed.

In the case where the thickness direction of a Group III nitride-based compound semiconductor layer is the c-axis direction and a plurality of such semiconductor layers are stacked, the interface between two layers assumes C-plane. In this case, the following problem is known to arise in an HEMT or a light-emitting device having an MQW light-emitting layer.

In an HEMT having a two-dimensional electron gas layer provided between an InAlGaN layer and an $n^-$-type GaN layer, when the polarization of the InAlGaN layer is greater than that of GaN and each interlayer interface assumes C-plane, electrons tend to be accumulated in a hetero-interface. Thus, in this case, device characteristics of interest may fail to be attained. For example, normally-off cannot be attained.

When a Group III nitride-based compound semiconductor is formed on a sapphire substrate having R-plane ((1-102) plane) as a main plane such that A-plane ((11-20) plane); i.e., a non-polar surface, of the semiconductor serves as a growth surface, a polarization field perpendicular to a hetero-interface is not formed. In this case, generally, a normally-off transistor can be produced, and electrons can run without being affected by a polarization field, which is advantageous in high-speed operation.

In relation to light-emitting devices, there has been proposed a so-called type-II quantum well active layer, which is an MQW light-emitting layer (active layer) in which electrons are quantumized and confined in one layer, and holes in another layer. When a type-II quantum well active layer is provided on a non-polar surface such as non-polar A-plane ((11-20) plane), the active layer is not affected by polarization, and high light emission efficiency is realized.

Thus, recently, a A-plane GaN substrate or a M-plane GaN substrate have been commercialized, and devices in which a Group III nitride-based compound semiconductor layer having a thickness direction of the a-axis or m-axis (i.e., non-polar axis) direction is provided on such a GaN substrate have become of interest.

Japanese Patent Application Laid-Open (kokai) No. 2007-43164 discloses that an electrode is difficult to form on the N-polar surface of an n-type GaN substrate, which is opposite the Ga-polar surface on which a device has been provided.

SUMMARY OF THE INVENTION

Even though an electrode, for example, a Ti/Al double-layer electrode, is formed on a non-polar A-plane or M-plane of Group III nitride-based compound semiconductor, an ohmic electrode cannot easily be formed, as compared with formation on a Ga-polar C-plane. Actually, a Ti/Al ohmic electrode can be formed on a Ga-polar C-plane through heating at 500 to 600° C., whereas heating at 700 to 900° C. is required for forming a Ti/Al ohmic electrode on an A-plane or M-plane. When such high temperature is applied to devices, device characteristics may be impaired.

In view of the foregoing, an object of the present invention is to form a negative electrode, through heating at relatively low temperature, in an n-type region having a main plane which is a non-polar A-plane or M-plane of a GaN substrate; which is an N-polar C-plane of a GaN substrate; or which is a plane other than a Ga-polar C-plane.

Accordingly, in a first aspect of the present invention, there is provided a Group III nitride-based compound semiconductor device produced through epitaxial growth of a Group III nitride-based compound semiconductor and having an n-type region provided with a negative electrode; wherein the n-type region is defined by a surface of an n-type Group III nitride-based compound semiconductor layer formed through epitaxial growth and has one or more surfaces which are not parallel to the c-axis and which are formed through etching on said surface assuming the main plane other than a Group-III-element-polar C-plane.

In a second aspect of the present invention, there is provide a Group III nitride-based compound semiconductor device produced through epitaxial growth of a Group III nitride-based compound semiconductor and having an n-type region provided with a negative electrode; wherein the n-type region is defined by a surface of an n-type Group III nitride-based compound semiconductor substrate, said surface assuming an A-plane or M-plane as its main plane, and are provided with surfaces which are not parallel to the c-axis and which are formed through etching.

As used herein, the term "Group-III-element-polar" refers to Ga-polar in the case of GaN. In the cases of mixed crystals or other semiconductors, Group III element atoms are present at the surface of a layer and are each bonded to three nitrogen atoms present in the layer or a substrate. According to the first aspect, when the n-type region is defined by a surface of a Group III nitride-based compound semiconductor film formed through epitaxial growth, the plane of the n-type region assumes a plane other than a Group-III-element-polar C-plane. The term "a plane other than a Group-III-element-polar C-plane" refers to an N-polar C-plane or a plane other than a C-plane. In the plane, other surfaces which are not parallel to the c-axis are formed through etching. The term "a surface which is not parallel to the c-axis" refers to, for example, a surface assuming a plane other than an A-plane or an M-plane. Most preferably, a surface which is perpendicular to the c-axis; i.e., a surface assuming a C-plane, is exposed. According to the second aspect, when the n-type region is defined by a main plane of a Group III nitride-based compound semiconductor substrate, the main plane assumes an A-plane or M-plane. In the A-plane or M-plane, other surfaces which are not parallel to the c-axis are formed through etching.

The surfaces which are parallel to the c-axis are, for example, surfaces assuming an A-plane or an M-plane. Thus, in the present invention, the surfaces which are not parallel to the c-axis mean surfaces assuming a C-plane or slanted surfaces tilted with respect to the epitaxial growth surface. The slanted surface is represented by indices $(a_1 a_2 a_3 c)$, wherein c is not 0. The most preferred surface is a C(0001) surface. When the surface is other than a surface assuming a C-plane, a surface having a larger value of "c" is preferred. The angle between the normal line of the surface and the c-axis is ideally 0°, preferably 45° or lower, more preferably 30° or lower, still more preferably 15° or lower. When the angle falls within the above ranges, Ga-polarity predominates at the exposed surface. In other words, the gist of the present invention resides in that a negative electrode is not directly formed on an A(11-20) plane or an M(1-100) plane, but is formed through providing, through etching in advance, a surface assuming C-plane or a surface which does not assume at least an A-plane or an M-plane. When a negative electrode is formed on a slanted surface such as a (11-22) surface or a (11-24) surface; i.e., "a semi-polar surface," according to the present invention, a surface having characteristics more similar to those of C-plane is formed through etching. For example, the C-plane can be exposed through weak etching of an epitaxial film having a small off angle from the C-plane, although the C-plane has high etching resistance.

A third aspect of the present invention is drawn to a specific embodiment of the device according to the first aspect, wherein the n-type region provided with the negative electrode is defined by a surface of the semiconductor layer assuming an A-plane as its main plane, and at least a Group-III-element-polar C-plane region formed through etching is exposed to the negative electrode, i.e., contacted with the negative electrode.

A fourth aspect of the present invention is drawn to a specific embodiment of the device according to the second aspect, wherein at least a Group-III-element-polar C-plane region formed through etching is exposed to the negative electrode, i.e., contacted with the negative electrode, formed on a surface of the n-type Group III nitride-based compound semiconductor substrate, said surface assuming an A-plane or M-plane as its main plane.

A fifth aspect of the present invention is drawn to a specific embodiment of the device according to the first or third aspect, wherein the Group III nitride-based compound semiconductor is epitaxially grown on a sapphire substrate having an R-plane plane as its main plane. The Group III nitride-based compound semiconductor grown in the R-plane of the sapphire substrate has an A-plane growth surface, with the a-axis being the axis of growth.

A sixth aspect of the present invention is drawn to a specific embodiment of the device according to the preceding aspects, wherein the negative electrode is provided through sequentially forming, through vapor deposition, a first metal layer containing at least titanium (Ti) or vanadium (V), and a second metal layer containing at least aluminum (Al).

The negative electrode provided on a surface of a Group III nitride-based compound semiconductor other than a surface assuming a Group-III-element-polar C-plane is difficult to form as an ohmic electrode. Thus, in the formation of a negative electrode on a surface of a Group III nitride-based compound semiconductor other than a surface assuming a Group-III-element-polar C-plane, a surface having characteristics more similar to those of C-plane is formed. As a result, the exposed surface exhibits Group-III-element-polarity, and the negative electrode can serve as an ohmic electrode through heating at relatively low temperature.

This technique is advantageous particularly when a negative electrode is formed on an A-plane or M-plane, which is a surface parallel to the c-axis of the Group III nitride-based compound semiconductor. Since the crystal orientation of the epitaxial film can be identified by the crystal orientation of the growth substrate, stripe-patterned microditches or a similar structure each having C-plane side walls can be readily formed through etching. Each microditch has oppositely facing side walls, one of which is an N-polar surface and the other of which is a Ga-polar surface. Therefore, although the N-polar side-surface is exposed, i.e., contacted with the negative electrode, the other exposed Ga-polar side-surface, i.e., contacted with the negative electrode, exhibits the effect of the invention. A portion of the negative electrode which is in contact with the Ga-polar C-plane readily provides an ohmic electrode through heating at comparatively low temperature.

The present invention is also advantageous, when a negative electrode is formed on a surface of Group III nitride-based compound semiconductor other than a surface assuming the A-plane or M-plane, for example; on an N-polar C-plane. According to the present invention, a surface on which an ohmic electrode can be more readily formed as compared with an un-etched surface is exposed through etching. In this case, the exposed surface preferably has characteristics more similar to those of a Ga-polar C-plane.

The present invention is also advantageous particularly when the negative electrode is formed from a Ti/Al double-layer or from a metal multi-layer including a Ti-containing layer and an Al-containing layer. For example, when the above negative electrode is formed on a Ga-polar C-plane of n-GaN, Ti forms TiN thin film through substitution by Ga atoms present at the surface of n-GaN. The thus-formed TiN thin film is thought to enhance the ohmic property. If the negative electrode is formed on a surface other than a surface assuming the Ga-polar C-plane, substitution of Ga by Ti is difficult, or TiN thin film does not completely cover the surface. For such reasons, the ohmic property cannot be enhanced. Thus, through exposing a Ga-polar C-plane by etching or forming a surface exhibiting higher Ga-polarity by etching, the negative electrode formed from a metal multi-layer including a Ti-containing layer and an Al-containing layer exhibits an enhanced ohmic property. This technique is also applicable to mixed crystals other than n-GaN.

Furthermore, this technique is also applicable to formation of a negative electrode from a V/Al double-layer or from a metal multi-layer including a V-containing layer and an Al-containing layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A characteristic feature of the present invention resides in that when a negative electrode is formed on a surface other than a surface assuming a Group-III-element-polar C-plane, a surface exhibiting higher Ga-polarity, most preferably a surface assuming C-plane, is exposed through etching. No particular limitation is imposed on the structure and characteristics of the semiconductor device to which the present invention is applied, so long as the above characteristic feature is maintained.

It is not always difficult to form a C-plane through etching in a surface other than a surface assuming a Group-III-element-polar C-plane. When the epitaxial growth surface assumes an A-plane or M-plane, the C-plane orientation of the Group III nitride-based compound semiconductor layer can be identified from the orientation flat of the substrate employed. For example, when a stripe-shape mask is formed, the longitudinal direction of the stripe is caused to adjust to be parallel to the C-plane of the Group III nitride-based compound semiconductor layer; i.e., to be perpendicular to the c-axis. Then, microditches are formed through dry etching so that they are perpendicular to the A-plane or M-plane serving as a growth surface and parallel to the C-plane. Both side walls of each microditch assume the C-plane of the Group III nitride-based compound semiconductor layer, although one of the side walls which is an N-polar surface, the other is a Ga-polar surface. Therefore, ohmic contact between the electrode and the semiconductor can be enhanced by the mediation of the Ga-polar surface.

Embodiment 1

Figure 1:
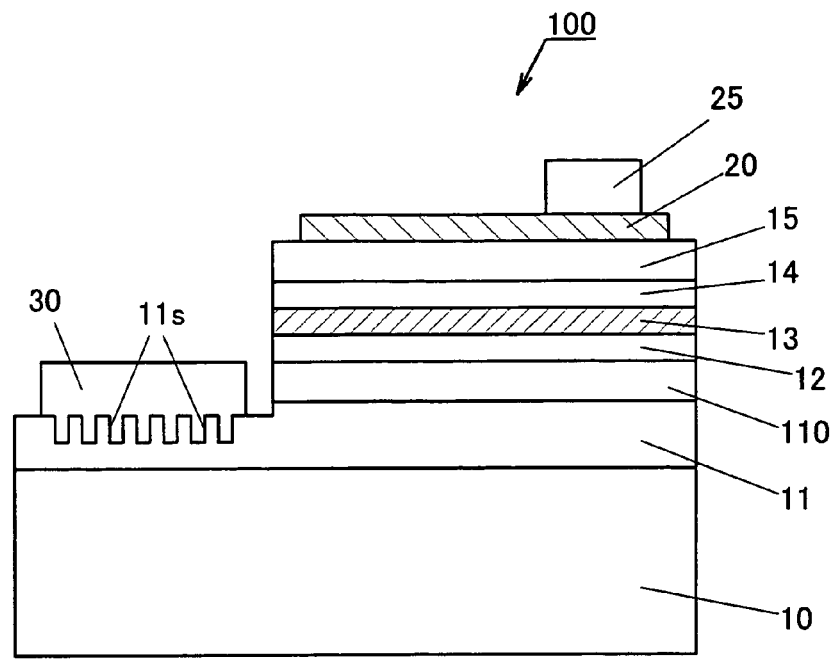
FIG. 1 is a cross-section of a Group III nitride-based compound semiconductor light-emitting device 100, which is an embodiment of the present invention.

FIG. 1 is a cross-section of a Group III nitride-based compound semiconductor light-emitting device 100, which is one embodiment of the present invention. The Group III nitride-based compound semiconductor light-emitting device 100 has the following Group III nitride-based compound semiconductor layers stacked through epitaxial growth on an R-plane sapphire substrate 10. The thickness direction of each layer coincides with the a-axis direction. Specifically, a buffer layer (not illustrated, thickness: about 15 nm) formed of aluminum nitride (AlN) is provided on the R-plane sapphire substrate 10, and an n-contact layer 11 (thickness: about 4 μm) made of silicon (Si)-doped GaN is formed on the buffer layer. On the n-contact layer 11, a layer 110 for improving static breakdown voltage is formed from a stacked structure including an undoped GaN layer (thickness: 300 nm) and a silicon (Si)-doped GaN layer (thickness: 30 nm). On the layer 110 for improving static breakdown voltage, there is formed an n-cladding layer 12 (thickness: about 74 nm) made of a multi-layer structure having ten stacked sets of an undoped $In_{0.1}Ga_{0.9}N$ layer, an undoped GaN layer, and a silicon (Si)-doped GaN layer.

On the n-cladding layer 12, there is provided a multi-quantum well (MQW) light-emitting layer 13 made of a combination of seven well $In_{0.25}Ga_{0.75}N$ layers (thickness: about 3 nm) and GaN barrier layers (thickness: 3 nm) stacked alternatingly. On the light-emitting layer 13, a p-cladding layer 14 (thickness: about 33 nm) made of a multi-layer structure including a p-$Al_{0.3}Ga_{0.7}N$ layer and a p-$In_{0.08}Ga_{0.92}N$ layer is formed. On the p-cladding layer 14, there is provided a p-contact layer 15 (thickness: about 80 nm) made of a stacked structure including two p-GaN layers having different magnesium concentrations.

An optically transparent electrode 20 made of indium tin oxide (ITO) is formed on the p-contact layer 15, and a negative electrode 30 is formed on the exposed surface of the n-contact layer 11. The negative electrode 30 is formed from a titanium (Ti) layer (thickness: about 20 nm) and an aluminum (Al) layer (thickness: about 2 μm). An electrode pad 25 made of gold (Au) alloy is formed on the optically transparent electrode 20.

The exposed surface of the n-contact layer 11 is provided with stripe-patterned microditches through etching. The stripe-patterned microditches 11s each have side walls, which assume a C-plane of the n-contact layer 11. The width of each microditch and the inter-ditch distance are adjusted to 0.2 μm, and the depth of each ditch is adjusted to 1 μm. The stripe-patterned microditches are formed on the entirety of the region where the negative electrode 30 has been formed. Note that the microditch width, the inter-ditch distance, and the ditch depth may be individually adjusted to desired values. By virtue of the thus-provided microditches, the negative electrode 30 having a Ti/Al stacked structure exhibits excellent ohmic contact with the C-plane side walls 11s formed in the n-contact layer 11. The ohmic contact can be readily attained particularly with the Ga-polar C-plane side walls. In order to form an ohmic negative electrode, the negative electrode 30 is annealed at 400 to 600° C. For example, heating at about 500° C. is sufficient for realizing annealing.

Embodiment 2

Figure 2:
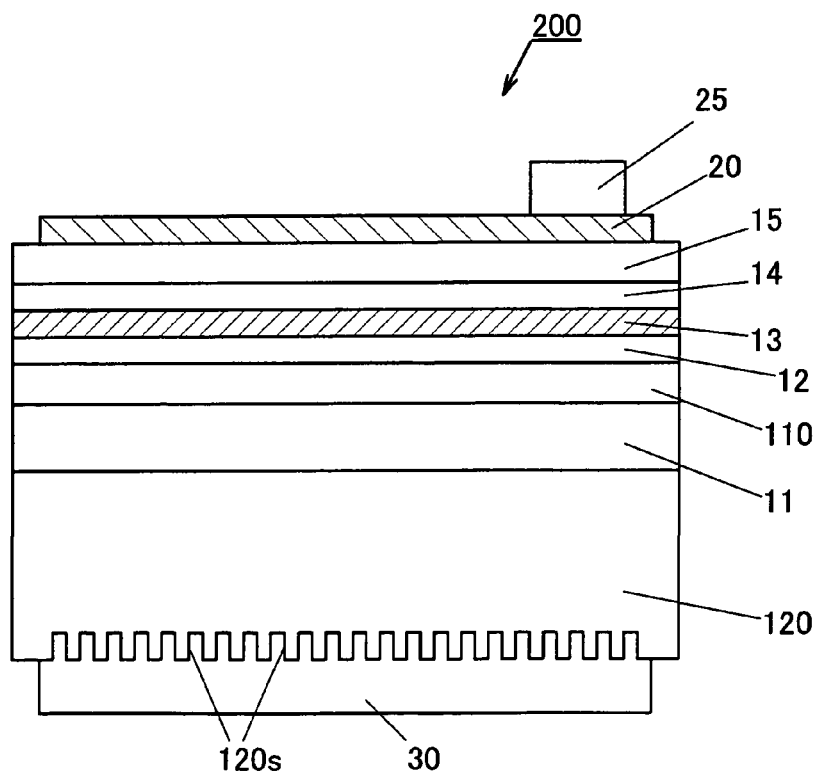
FIG. 2 is a cross-section of a Group III nitride-based compound semiconductor light-emitting device 200, which is another embodiment of the present invention.

FIG. 2 is a cross-section of a Group III nitride-based compound semiconductor light-emitting device 200, which is another embodiment of the present invention. The Group III nitride-based compound semiconductor light-emitting device 200 has the following Group III nitride-based compound semiconductor layers stacked through epitaxial growth on an A-plane n-GaN substrate 120. The thickness direction of each layer coincides with the a-axis direction. Specifically, an n-contact layer 11 (thickness: about 4 μm) made of silicon (Si)-doped GaN is formed on the A-plane n-GaN substrate 120. On the n-contact layer 11, a layer 110 for improving static breakdown voltage is formed from a stacked structure including an undoped GaN layer (thickness: 300 nm) and a silicon (Si)-doped GaN layer (thickness: 30 nm). On the layer 110 for improving static breakdown voltage, there is formed an n-cladding layer 12 (thickness: about 74 nm) made of a multi-layer structure having ten stacked sets of an undoped $In_{0.1}Ga_{0.9}N$ layer, an undoped GaN layer, and a silicon (Si)-doped GaN layer.

On the n-cladding layer 12, there is provided a multi-quantum well (MQW) light-emitting layer 13 made of a combination of seven well $In_{0.25}Ga_{0.75}N$ layers (thickness: about 3 nm) and GaN barrier layers (thickness: 3 nm) stacked alternatingly. On the light-emitting layer 13, a p-cladding layer 14 (thickness: about 33 nm) made of a multi-layer structure including a p-type $Al_{0.3}Ga_{0.7}N$ layer and a p-$In_{0.08}Ga_{0.92}N$ layer is formed. On the p-cladding layer 14, there is provided a p-contact layer 15 (thickness: about 80 nm) made of a stacked structure including two p-GaN layers having different magnesium concentrations.

An optically transparent electrode 20 made of indium tin oxide (ITO) is formed on the p-contact layer 15, and a negative electrode 30 is formed on the back surface of the n-GaN substrate 120. The negative electrode 30 is formed from a titanium (Ti) layer (thickness: about 20 nm) and an aluminum (Al) layer (thickness: about 2 μm). An electrode pad 25 made of gold (Au) alloy is formed on the optically transparent electrode 20.

The back surface of the n-GaN substrate 120 is provided with stripe-patterned microditches through etching. The stripe-patterned microditches 120s each have side walls, which assume a C-plane of the n-GaN substrate 120. The width of each microditch and the inter-ditch distance are adjusted to 2 μm, and the depth of each ditch is adjusted to 5 μm. The stripe-patterned microditches are formed on the entirety of the region where the negative electrode 30 has been formed. Note that the microditch width, the inter-ditch distance, and the ditch depth may be individually adjusted to desired values. By virtue of the thus-provided microditches, the negative electrode 30 having a Ti/Al stacked structure exhibits excellent ohmic contact with the C-plane side walls 120s formed in the n-GaN substrate 120. The ohmic contact can be readily attained particularly with the Ga-polar C-plane side walls. In order to form an ohmic negative electrode, the negative electrode 30 is annealed at 400 to 600° C. For example, heating at about 500° C. is sufficient for realizing annealing.

Modification of Embodiment 2

In the Group III nitride-based compound semiconductor light-emitting device 200 shown in FIG. 2, when the A-plane n-GaN substrate 120 is changed to an M-plane n-GaN substrate, the thickness direction of each layer coincides with the m-axis. The back surface of the M-plane n-GaN substrate is provided, through etching, with stripe-patterned microditches each having side walls, which assume a C-plane. In this case, the negative electrode can be annealed at about 500° C.

Embodiment 3

Figure 3:
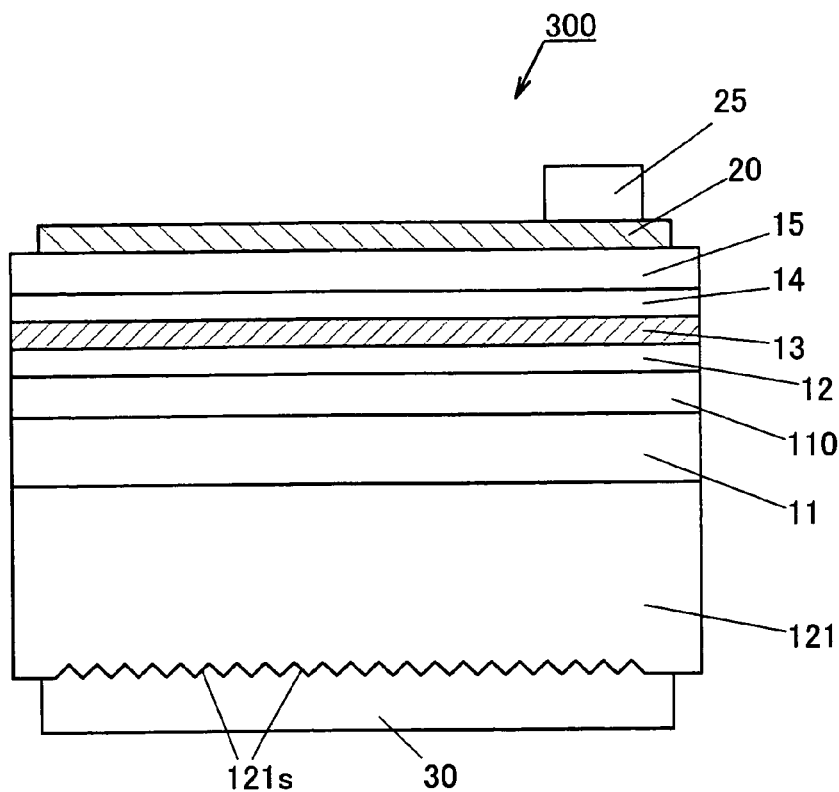
FIG. 3 is a cross-section of a Group III nitride-based compound semiconductor light-emitting device 300, which is still another embodiment of the present invention.

FIG. 3 is a cross-section of a Group III nitride-based compound semiconductor light-emitting device 300, which is still another embodiment of the present invention. The Group III nitride-based compound semiconductor light-emitting device 300 shown in FIG. 3 has the same structure as that of the Group III nitride-based compound semiconductor light-emitting device 200 shown in FIG. 2, except that a C-plane n-GaN substrate 121 is employed instead of the A-plane n-GaN substrate 120. In this case, the epitaxial growth surface is a Ga-polar surface, and the other surface where a negative electrode is formed is an N-polar surface. In this structure, rather than provision of surfaces perpendicular to the N-polar C-plane, a surface embossment is preferably formed in the form of slanted surfaces 121s. In FIG. 3, the slanting angle is adjusted to 45°.

The slanted surfaces may have a single slanting angle or different values. In Embodiment 3, slanted surfaces assuming A-plane or M-plane should not be exposed. Instead of forming an embossment; i.e., the slanted surfaces 121s, the entire back surface of the substrate may be processed to provide a single slanted surface having an off-angle of, for example, 45° or ≦10°.

Modification of Embodiment 3

In the Group III nitride-based compound semiconductor light-emitting device 300 shown in FIG. 3, an A-plane or M-plane n-GaN substrate may be employed instead of the C-plane n-GaN substrate 121. In this modification, slanted surfaces assuming A-plane or M-plane should not be exposed. Instead of forming an embossment; i.e., the slanted surfaces 121s, the entire back surface of the substrate may be processed to provide a single slanted surface having an off-angle of, for example, 45° or ≦10°.

Embodiment 4

Figure 4:
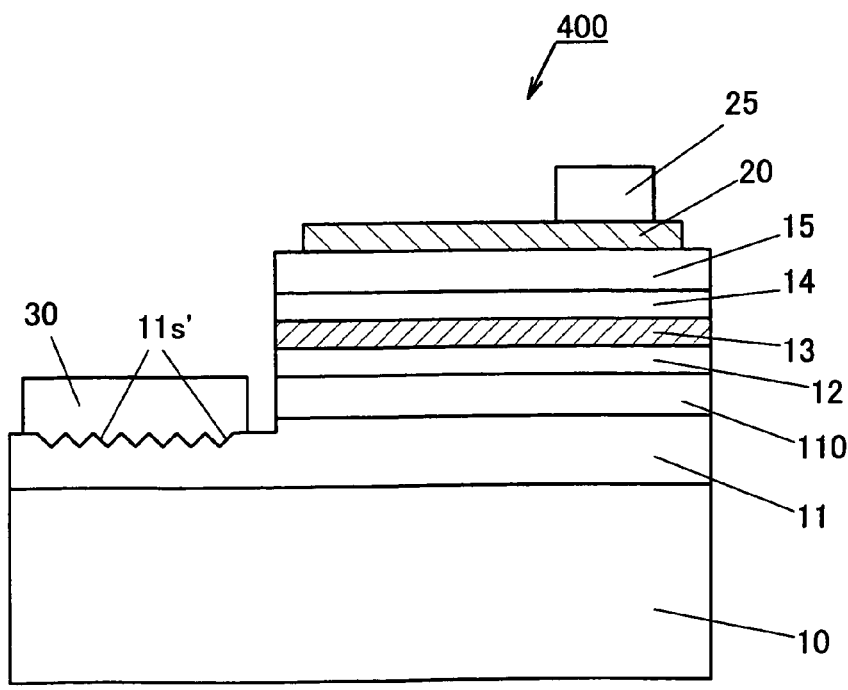
FIG. 4 is a cross-section of a Group III nitride-based compound semiconductor light-emitting device 400, which is yet another embodiment of the present invention.

FIG. 4 is a cross-section of a Group III nitride-based compound semiconductor light-emitting device 400, which is still another embodiment of the present invention. The Group III nitride-based compound semiconductor light-emitting device 400 shown in FIG. 4 has the same structure as that of the Group III nitride-based compound semiconductor light-emitting device 100 shown in FIG. 1, except that slanted surfaces 11s' are provided instead of the embossment of the n-contact layer 11. In FIG. 4, the slanting angle is adjusted to 45°.

The slanted surfaces may have a single slanting angle or different values. In Embodiment 4, slanted surfaces assuming A-plane or M-plane should not be exposed. Instead of forming an embossment; i.e., the slanted surfaces 11s', the entire back surface of the substrate may be processed to provide a single slanted surface having an off-angle of, for example, 45° or ≦10°.

Modification of Embodiment 4

In the Group III nitride-based compound semiconductor light-emitting device 400 shown in FIG. 4, when a hetero-substrate is employed instead of the R-plane sapphire substrate, epitaxial growth of a Group III nitride compound semiconductor occurs in a direction which is not the c-axis or a-axis direction, depending on the type of the main plane of the substrate. In such a case, a region where a negative electrode is formed is provided with an embossment which is a surface having characteristics more similar to those of C-plane. Preferably, in some cases, the C-plane-like surface is formed as a slanted surface rather than a surface parallel to the epitaxial growth direction. The slanted surfaces may have a single slanting angle or different values. In this modification, slanted surfaces assuming A-plane or M-plane should not be exposed.

What is claimed is:

1. A Group III nitride-based compound semiconductor device produced through epitaxial growth of a Group III nitride-based compound semiconductor and having an n-type region provided with a negative electrode,
   wherein the n-type region is defined by a surface of an n-type Group III nitride-based compound semiconductor layer formed through epitaxial growth, the surface being an A-plane or an M-plane as a main plane, and having at least one contact surface which is a Group-M-element-polar C-plane, the contact surface being formed through etching on said surface of the n-type region, and the negative electrode being in contact with the contact surface.

2. A Group III nitride-based compound semiconductor device as described in claim 1, wherein the contact surface comprises a side wall of microditches having a stripe shape.

3. A Group III nitride-based compound semiconductor device as described in claim 2, wherein the Group III nitride-based compound semiconductor is epitaxially grown on a sapphire substrate having an R-plane as its main plane.

4. A Group III nitride-based compound semiconductor device as described in claim 2, wherein the negative electrode is provided through sequentially forming, through vapor deposition, a first metal layer containing comprising at least titanium (Ti) or vanadium (V), and a second metal layer comprising at least aluminum (Al).

5. A Group III nitride-based compound semiconductor device as described in claim 1, wherein the Group III nitride-based compound semiconductor is epitaxially grown on a sapphire substrate having an R-plane as its main plane.

6. A Group III nitride-based compound semiconductor device as described in claim 5, wherein the negative electrode is provided through sequentially forming, through vapor deposition, a first metal layer comprising at least titanium (Ti) or vanadium (V), and a second metal layer comprising at least aluminum (Al).

7. A Group III nitride-based compound semiconductor device as described in claim 1, wherein the negative electrode is provided through sequentially forming, through vapor deposition, a first metal layer comprising at least titanium (Ti) or vanadium (V), and a second metal layer comprising at least aluminum (Al).

8. A Group III nitride-based compound semiconductor device as described in claim 1, wherein the negative electrode is formed on a non-polar plane comprising the A-plane or the M-plane.

9. A Group III nitride-based compound semiconductor device as described in claim 1, wherein the Group-III-element-polar C-plane is exposed on the A-plane or the M-plane.

10. A Group III nitride-based compound semiconductor device as described in claim 1, wherein the Group-III-element-polar C-plane is formed on the A-plane or the M-plane.

11. A Group III nitride-based compound semiconductor device as described in, claim 1, wherein the negative electrode contacts the Group-III-element-polar C-plane.

12. A Group III nitride-based compound semiconductor device produced through epitaxial growth of a Group III nitride-based compound semiconductor and having an n-type region provided with a negative electrode,
    wherein the n-type region is defined by a surface of an n-type Group III nitride-based compound semiconductor substrate, the surface being an A-plane or an M-plane as a main plane, and having at least one contact surface which is a Group-III-element-polar C-plane,
    the contact surface being formed through etching on said surface of the n-type region, and the negative electrode being in contacted with the contact surface.

13. A Group III nitride-based compound semiconductor device as described in claim 2, wherein the contact surface comprises a side wall of microditches having a stripe shape.

14. A Group III nitride-based compound semiconductor device as described in claim 13, wherein the negative electrode is provided through sequentially forming, through vapor deposition, a first metal layer comprising at least titanium (Ti) or vanadium (V), and a second metal layer comprising at least aluminum (Al).

15. A Group III nitride-based compound semiconductor device as described in claim 12, wherein the negative electrode is provided through sequentially forming, through vapor deposition, a first metal layer comprising at least titanium (Ti) or vanadium (V), and a second metal layer comprising at least aluminum (Al).

16. A Group III nitride-based compound semiconductor device as described in claim 12, wherein the negative electrode is formed on a non-polar plane comprising the A-plane or the M-plane.

17. A Group III nitride-based compound semiconductor device as described in claim 12, wherein the Group-III-element-polar C-plane is exposed on the A-plane or the M-plane.

18. A Group III nitride-based compound semiconductor device as described in claim 12, wherein the Group-III-element-polar C-plane is formed on the A-plane or the M-plane.

19. A Group III nitride-based compound semiconductor device as described in claim 12, wherein the negative electrode contacts the Group-III-element-polar C-plane.

* * * * *

UNITED STATES PATENT AND TRADEMARK OFFICE
CERTIFICATE OF CORRECTION

PATENT NO. : 7,948,061 B2
APPLICATION NO. : 12/219695
DATED : May 24, 2011
INVENTOR(S) : Yoshiki Saito and Yasuhisa Ushida It is certified that error appears in the above-identified patent and that said Letters Patent is hereby corrected as shown below:

AMENDMENTS TO THE CLAIMS:

1. Claim 1, Col. 9, Line 21 and Line 22

Please change from: "Group-M-element-polar C-plane,"

to: "Group-III-element-polar C-plane,"

2. Claim 4, Col. 9, line 36

Please delete "containing" before "comprising",

"deposition, a first metal layer ~~containing~~ comprising at least"

3. Claim 11, Col. 10, Line 12

Please delete "," before "claim 1".

"device as described in [[,]] claim 1, wherein the negative elec—"

Signed and Sealed this
Ninth Day of August, 2011

David J. Kappos
*Director of the United States Patent and Trademark Office*